United States Patent
Miyajima et al.

(10) Patent No.: US 7,379,174 B2
(45) Date of Patent: May 27, 2008

(54) WAFER DETECTING DEVICE

(75) Inventors: Toshihiko Miyajima, Tokyo (JP); Tsutomu Okabe, Tokyo (JP); Mutsuo Sasaki, Tokyo (JP)

(73) Assignee: TDK Corporation, Tokyo (JP)

( * ) Notice: Subject to any disclaimer, the term of this patent is extended or adjusted under 35 U.S.C. 154(b) by 31 days.

(21) Appl. No.: 11/257,311

(22) Filed: Oct. 25, 2005

(65) Prior Publication Data

US 2006/0087661 A1    Apr. 27, 2006

(30) Foreign Application Priority Data

Oct. 26, 2004   (JP)   ............... 2004-310326

(51) Int. Cl.
  *G01N 21/88*    (2006.01)
(52) U.S. Cl. .............. 356/237.4; 356/237.5; 356/239.1
(58) Field of Classification Search .. 356/237.1–237.5, 356/239.1–239.4
  See application file for complete search history.

(56) References Cited

U.S. PATENT DOCUMENTS

| | | | |
|---|---|---|---|
| 3,792,930 A * | 2/1974 | Obenreder | 356/445 |
| 3,871,773 A * | 3/1975 | Shaw, Jr. | 356/431 |
| 5,243,402 A * | 9/1993 | Weber et al. | 356/429 |
| 5,443,164 A * | 8/1995 | Walsh et al. | 209/580 |
| 5,754,294 A * | 5/1998 | Jones et al. | 356/503 |
| 5,780,849 A | 7/1998 | Kikuchi | |
| 6,013,920 A | 1/2000 | Gordon et al. | |
| 6,053,983 A | 4/2000 | Saeki et al. | |
| 6,082,949 A | 7/2000 | Rosenquist | |
| 6,097,204 A | 8/2000 | Tanaka et al. | |
| 6,138,721 A | 10/2000 | Bonora et al. | |
| 6,175,645 B1 * | 1/2001 | Elyasaf et al. | 382/147 |
| 6,188,323 B1 | 2/2001 | Rosenquist et al. | |
| 6,220,808 B1 | 4/2001 | Bonora et al. | |
| 6,281,516 B1 | 8/2001 | Bacchi et al. | |
| 6,298,280 B1 | 10/2001 | Bonora et al. | |
| 6,364,745 B1 | 4/2002 | Gonzalez-Martin et al. | |
| 6,390,754 B2 | 5/2002 | Yamaga et al. | |
| 6,396,072 B1 | 5/2002 | Meyhofer et al. | |
| 6,618,136 B1 * | 9/2003 | Ishida | 356/239.1 |
| 6,642,997 B2 | 11/2003 | Yamada | |
| 2003/0067603 A1 * | 4/2003 | Horie | 356/369 |

FOREIGN PATENT DOCUMENTS

JP    3-159233    7/1991

(Continued)

*Primary Examiner*—Hoa Q Pham
(74) *Attorney, Agent, or Firm*—Oblon, Spivak, McClelland, Maier & Neustadt, P.C.

(57) ABSTRACT

Provided is a detecting device for an FIMS system, for easily and simply detecting a slip-out of a glass wafer from an FOUP or detective storage thereof. The detecting device includes a light transmission sensor and a light reflection sensor. A light emitting portion of the light reflection sensor, a light receiving portion thereof, and one of a light emitting portion of the light transmission sensor and a light receiving portion thereof are disposed on one surface side of a substrate to be detected in a position in which the substrate is located. The other of the light emitting portion of the light transmission sensor and the light receiving portion thereof is disposed on the other surface side of the substrate to be detected in the position in which the substrate is located.

5 Claims, 6 Drawing Sheets

FOREIGN PATENT DOCUMENTS

| | | |
|---|---|---|
| JP | 5-38876 | 5/1993 |
| JP | 5-291382 | 11/1993 |
| JP | 8-213447 | 8/1996 |
| JP | 9-237810 | 9/1997 |
| JP | 10-308438 | 11/1998 |
| JP | 11-3297 | 1/1999 |
| JP | 11-31738 | 2/1999 |
| JP | 11-214483 | 8/1999 |
| JP | 11-233595 | 8/1999 |
| JP | 2000-133697 | 5/2000 |
| JP | 2000-223554 | 8/2000 |
| JP | 2001-56210 | 2/2001 |
| JP | 2001-516152 | 9/2001 |
| JP | 2001-284439 | 10/2001 |
| JP | 2002-9133 | 1/2002 |
| JP | 2002-164411 | 6/2002 |
| JP | 2002-246358 | 8/2002 |
| JP | 2003-100852 | 4/2003 |
| JP | 2003-197705 | 7/2003 |
| JP | 2003-273197 | 9/2003 |
| JP | 2003-289097 | 10/2003 |
| WO | WO 99/13498 | 3/1999 |

\* cited by examiner

WAFER DETECTING DEVICE

BACKGROUND OF THE INVENTION

1. Field of the Invention

The present invention relates to a so-called front-opening interface mechanical standard (FIMS) system used when wafers held in a transfer container which is called a pod are transferred among semiconductor processing apparatuses in a semiconductor manufacture process or the like. More specifically, the present invention relates to a detecting device for detecting the states of wafers in the FIMS system in which a pod containing the wafers which is called a front-opening unified pod (FOUP) is placed and the wafers are moved using the pod.

2. Related Background Art

Up to now, a semiconductor manufacture process has been conducted in a so-called clean room in which a room in which semiconductor wafers are treated has high cleanliness. However, in order to increase the wafer size and reduce the cost required to maintain the room clean, a method of maintaining the inner portion of a processing apparatus, the pod (wafer container), and a mini-environment for substrate transfer from the pod to the processing apparatus with a high cleanliness state has been employed in recent years.

The pod includes a main body portion having a substantially cube shape and a lid. The main body portion includes a rack capable of holding a plurality of wafers therein with a state in which the wafers are separated from one another in parallel and an opening portion which is provided on a surface of the rack and is used for wafer transfer. The opening portion is closed with the lid. A pod in which a forming surface of the opening portion is located not vertically below the pod but on a side surface of the pod (in front of the mini-environment) is generically called a front-opening unified pod (FOUP). The present invention is mainly for a structure using the FOUP.

The above-mentioned mini-environment includes a first opening portion opposed to the opening portion of the pod, a door for closing the first opening portion, a second opening portion provided on a semiconductor processing apparatus side, and a movable robot that moves from the first opening portion to the inner portion of the pod to hold the wafer and passes through the second opening portion to transfer the wafer to the semiconductor processing apparatus side. The structure for forming the mini-environment includes a mount base for supporting the pod so that the opening portion of the pod is simultaneously opposed to the front surface of the door.

A positioning pin inserted into a positioning hole provided on a lower surface of the pod to regulate a mount position of the pod and a clamp unit engaged with a portion to be clamped which is provided on the lower surface of the pod to hold the pod to the mount base are located on an upper surface of the mount base. The mount base is normally movable in a door direction by a predetermined distance. When the wafers in the pod are to be transferred to the processing apparatus, the pot is moved in a state in which the pod is mounted until the lid of the pod comes in contact with the door. After that contact, the pod is opened by the door and the lid is removed. Therefore, the inner portion of the pod is connected to the inner portion of the processing apparatus through the mini-environment. Subsequently, wafer transfer operation is repeated. A system including the mount base, the door, the first opening portion, a door open-and-close mechanism, and a wall which is a part of the mini-environment including the first opening portion is generally called a front-opening interface mechanical standard (FIMS) system.

When the operation for closing the pod with the lid is to be performed, it is necessary to store all the wafers in the pod at predetermined positions as a precondition. However, for example, there may be a case where one of the wafers is not accurately placed on the rack of the pod from some causes and thus a part of the wafer exists out of the opening portion of the pod. When the normal lid-close operation is performed in such a situation, it is likely to cause a large process problem such as a damage to the wafer. Therefore, normally, a sensor for detecting the slip-out of a wafer from the pod is provided to detect such a situation, thereby preventing, for example, the damage to the wafer. Examples of such a detection device are disclosed in Japanese Patent Application Laid-open No. 2003-273197, Japanese Patent Application Laid-open No. 2003-100852, and Japanese Patent Application Laid-open No. 05-291382.

In recent years, a so-called glass wafer made of quartz or the like is used in the semiconductor manufacture process in many cases. Apparatuses for detecting the slip-out of the wafer as described in Japanese Patent Application Laid-open No. 2003-273197, Japanese Patent Application Laid-open No. 2003-100852, and Japanese Patent Application Laid-open No. 05-291382 include a so-called transmission sensor for detecting the presence or absence of the wafer depending on whether or not light is blocked by the wafer. However, when the glass wafer is used, the wafer transmits the light. Therefore, even when the glass wafer is located on the optical path of the sensor, it is difficult to detect the presence of the glass wafer. In addition, even in the FIMS system connected to a film formation apparatus, it is necessary to detect not only the presence or absence of a transparent wafer before film formation but also the presence or absence of an opaque wafer after the film formation without any change.

SUMMARY OF THE INVENTION

The present invention has been made in view of the above-mentioned circumstances. An object of the present invention is to provide a detecting device capable of detecting an opaque glass wafer which has subjected to film formation as in the cases of a transparent glass wafer and a silicon wafer during a semiconductor manufacture process in which a glass wafer is used.

To solve the above-mentioned problems, the present invention provides a detecting device for detecting a storage state of a substrate of a light transmission type in a predetermined position in a substrate processing apparatus using the substrate, including: a light reflection sensor including a light emitting portion and a light receiving portion; and a light transmission sensor including a light emitting portion and a light receiving portion, in which the light receiving portion of the light reflection sensor, the light emitting portion thereof, and one of the light emitting portion of the light transmission sensor and the light receiving portion thereof are disposed on one surface side of the substrate to be detected in a position in which the substrate is located, and the other of the light emitting portion of the light transmission sensor and the light receiving portion thereof is disposed on the other surface side of the substrate to be detected in the position in which the substrate is located.

In the above-mentioned detecting device, it is preferable that sensor light emitted from the light emitting portion of the light reflection sensor be set so that an emission area of the sensor light on the substrate becomes larger than an emission area of the sensor light when the sensor light is emitted from the light emitting portion. The detecting device includes a bracket for supporting the other of the light emitting portion of the light transmission sensor and the light receiving portion thereof. It is preferable that a direction of a normal line of a surface of the bracket substantially facing the substrate to be detected be different from an optical axis direction of the light receiving portion of the light reflection sensor. In the above-mentioned detecting device, preferably, it is determined that the substrate is located in a detection position when at least one of a substrate detection signal generated by the light reflection sensor and a substrate detection signal generated by the light transmission reflection sensor is received. It is also preferable that the sensor light used for the light transmission sensor and the light reflection sensor includes red visible light.

According to the present invention, even when any opaque glass wafer which has subjected to film formation is slipped out from an FOUP as in the cases of a transparent glass wafer and a silicon wafer, such a state can be surely detected. Therefore, even when a transparent wafer such as a glass wafer is used, semiconductor manufacture equipment using a FIMS system can be constructed as in a conventional case.

The above and other objects, features, and advantages of the invention will become more apparent from the following detailed description taken in conjunction with the accompanying drawings.

DETAILED DESCRIPTION OF THE PREFERRED EMBODIMENT

Figure 1A:
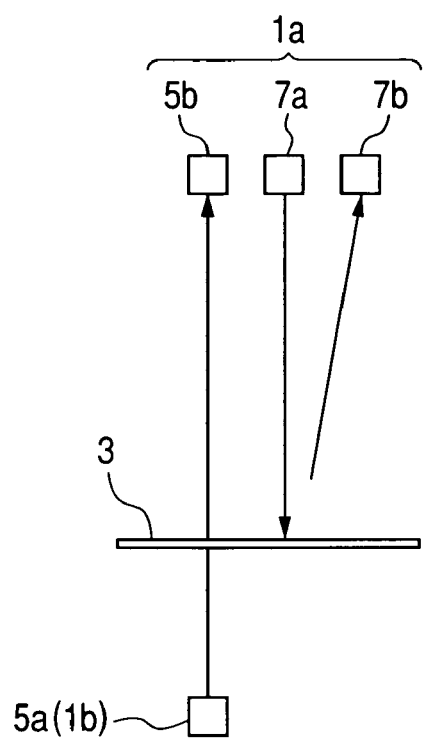
FIG. 1A is a schematic view showing a principle in which a glass wafer is detected by a detecting device according to an embodiment of the present invention and FIG. 1B is a schematic view showing a principle in which a glass wafer which has been subjected to film formation is detected by the detecting device according to the embodiment of the present invention.
Figure 1B:
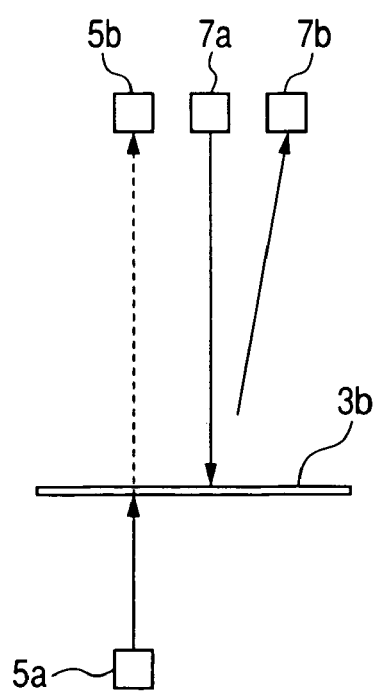

Hereinafter, a best mode for embodying the present invention will be described with reference to the drawings. FIGS. 1A and 1B are schematic views showing a main structure of the present invention and a principle thereof. A detecting device according to an embodiment of the present invention includes a light transmission sensor having a light emitting portion 5a and a light receiving portion 5b and a light reflection sensor having a light emitting portion 7a and a light receiving portion 7b. That is, according to a structure in the present invention, the light emitting portion of the light reflection sensor, the light receiving portion thereof, and one of the light emitting portion of the light transmission sensor and the light receiving portion thereof are disposed on one surface side of a substrate to be detected (the same surface side as a processed surface of the substrate or a surface side different therefrom) in a position in which the substrate is located (slip-out position from a pod in this embodiment). In addition, the other of the light emitting portion of the light transmission sensor and the light receiving portion thereof is disposed on the other surface side of the substrate to be detected in the position in which the substrate is located.

Even in the case of the transparent glass wafer, a part of emitted light is reflected thereon. Therefore, when a transparent glass wafer 3 is located in a detection area, a part of sensor light emitted from the light emitting portion 7a of the light reflection sensor is reflected on the glass wafer 3. The reflected part of the sensor light is received by the light receiving portion 7b of the light reflection sensor to detect the presence or absence of the glass wafer 3. In the light transmission sensor, sensor light emitted from the light emitting portion 5a reaches the light receiving portion 5b regardless of the presence or absence of the glass wafer, so the presence of the transparent glass wafer 3 is not detected. As a result, when any sensor generates a detection signal, it can be determined that the glass wafer is located in the detection area.

Next, a detection operation in the case where a glass wafer 3b obtained after film formation is located in the detection area will be described. The presence of the glass wafer 3b obtained after the film formation is detected by any of the light transmission sensor and the light reflection sensor. However, when a film formed on the glass wafer 3b has, for example, an unevenness surface, the case where the sensor light is not suitably reflected thereon and thus sufficient sensor light does not reach the light receiving portion 7b of the light reflection sensor may be caused depending on a film formation condition. In the present invention, the light transmission sensor is further used and the presence of the wafer located in a predetermined position (slip-out position from a pod in this case) is recognized when each of detection signals from both of the sensors is in an "OR state". Therefore, it is possible to surely detect the presence or absence of the glass wafer regardless of the film formation.

Figure 2:
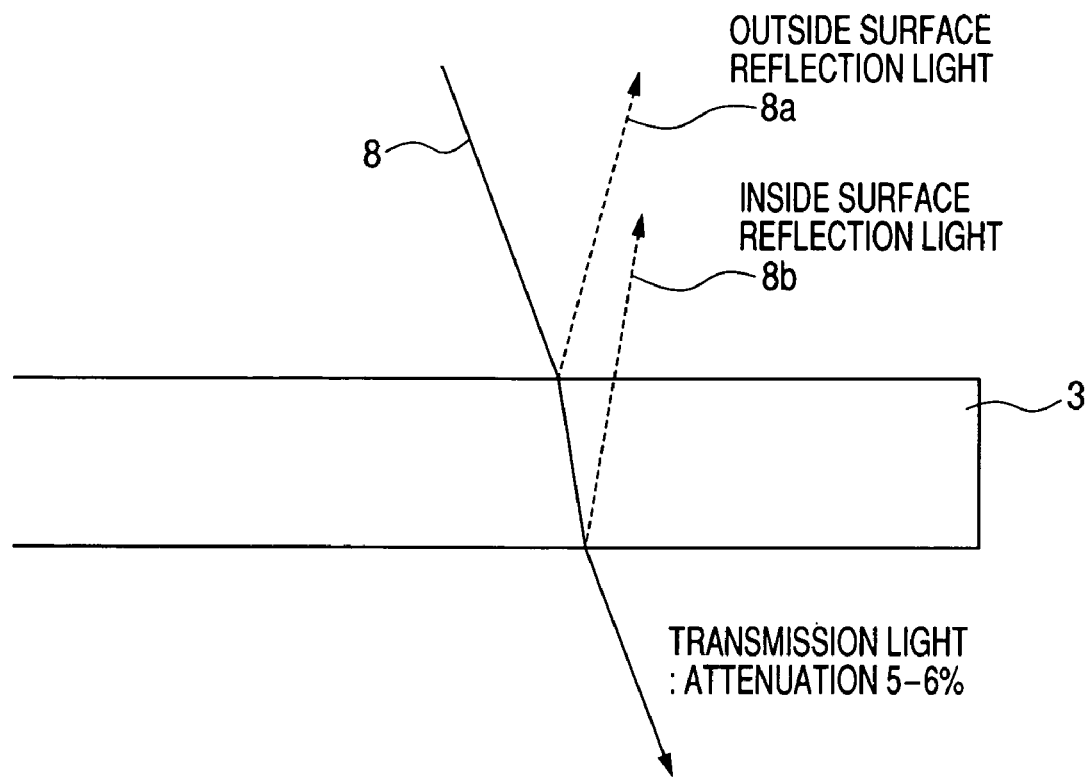
FIG. 2 is a schematic view showing a transmission state of sensor light to a transparent substrate.

In this embodiment, red visible light having a wavelength of 660 nm is used as the sensor light. The light having such a wavelength has a low attenuation factor in an inner portion of an optical fiber used as a sensor, so stable sensor light can be obtained. Here, a subsequent optical path of light emitted to a transparent glass wafer will be described with reference to FIG. 2. A part of sensor light 8 emitted to the transparent glass wafer 3 is reflected as outside surface reflection light 8a on a wafer surface thereof and a remaining part thereof is incident on an inner portion of the transparent glass wafer 3. When exiting from the transparent glass wafer 3, incident light is reflected as inside surface reflection light 8b on a exit surface (rear wafer surface). Reflection light from the glass wafer 3 mainly includes the outside surface reflection light 8a and the inside surface reflection light 8b.

Figure 3:
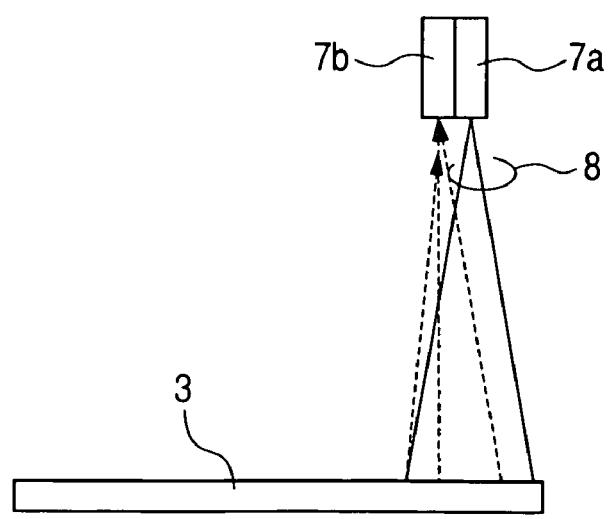
FIG. 3 is a schematic view showing a sensor light irradiation position and a light receiving state of a light reflection sensor in the detecting device according to the embodiment of the present invention.

It is found by experiment that the amount of sensor light passing through the transparent glass wafer 3 is attenuated 5% to 6% by the reflections. That is, 5% to 6% of the amount of the sensor light emitted from the light emitting portion 7a becomes reflection light. As is apparent from FIG. 3 schematically showing a sensor light emission state, the sensor light is emitted to the detection area with a state it has predetermined spread. Therefore, the outside surface reflection light and the inside surface reflection light which are described above are obtained as reflection light from various regions in a light emission area. Light obtained by a combination of those lights is received by the light receiving portion 7b. Thus, the actual amount of light received by the light receiving portion 7b becomes larger than 5% to 6% described above. As a result, when the reflection light is used, the suitable detection operation can be performed as compared with the case where the glass wafer is detected using transmission light.

In this embodiment, the description is made on the basis that a refractive index of the grass wafer is 1.5. However, this embodiment is not limited to this. More specifically, it is preferable to suitably change, for example, the wavelength of the used sensor light according to the refractive index of the grass wafer and the thickness thereof. When the reflection light is used, it is necessary to set the upper and lower limits of the amount of light to obtain the detection signal. When the amount of reflection light significantly varies and thus the reflection light is deviated from the detection area, a suitable detection signal cannot be obtained. In this embodiment, the influence caused by variation in sensor light is examined. Therefore, it is determined that accurate detection operation is performed when variation in the amount of light is within 6%.

Figure 4A:
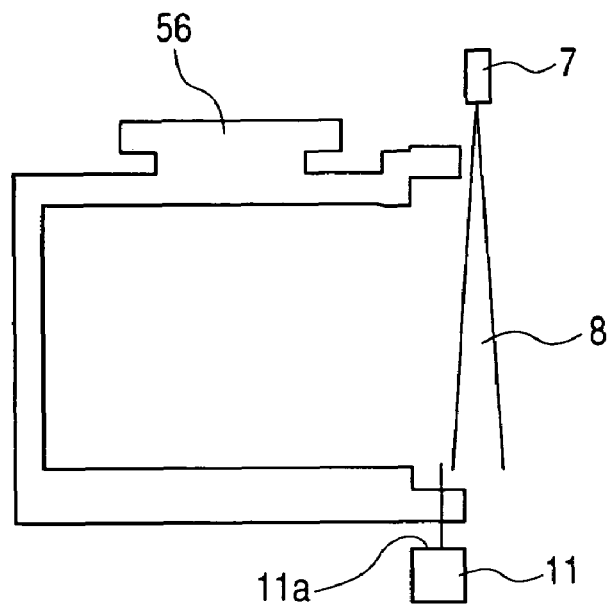
FIG. 4A is a schematic view showing a problem to be solved in the detecting device according to the embodiment of the present invention and FIG. 4B is a schematic view showing a suitable structure of a mounting bracket in the detecting device according to the embodiment of the present invention.
Figure 4B:
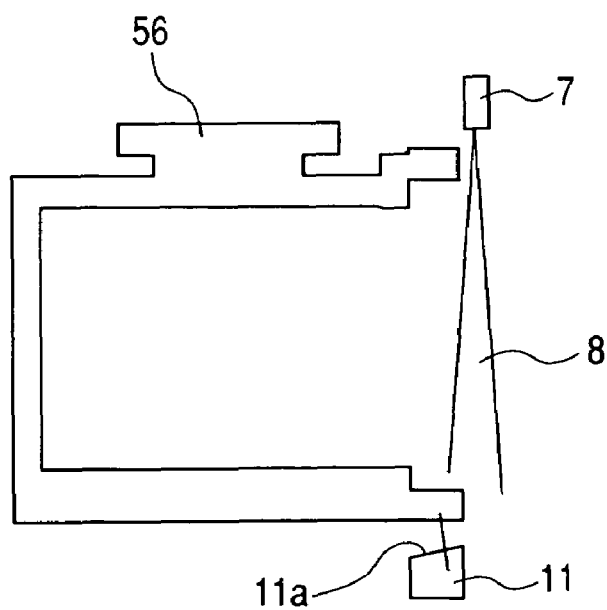

When the light reflection sensor is used, particularly, when the emission area is expanded with an increase in emission distance, it is necessary to consider parameters about the reflection of the sensor light on a member located below the glass wafer, such as a bottom surface shape of the FOUP and a refractive index thereof. FIGS. 4A and 4B show a normal arrangement with respect to an FOUP main body 56, the light reflection sensor 7, and a light transmission sensor mounting bracket 11 and an arrangement with respect to those, which is made in view of the reflection from a member other than the glass wafer. In FIG. 4A, a surface 11a of the light transmission sensor mounting bracket 11 which is opposed to the light reflection sensor normally faces the front surface of the light reflection sensor 7.

However, in the case of such an arrangement, the sensor light is reflected on the bracket 11, so reflection light thereon may be detected as the reflection light on the glass wafer by the light receiving portion 7b to cause erroneous determination. Therefore, as shown in FIG. 4B, the surface 11a of the light transmission sensor mounting bracket 11 is located so that the direction of a normal line thereof is different from the direction of the light reflection sensor 7 (particularly, the light receiving portion 7b). Thus, the sensor reflected on the surface 11a is not received by the light receiving portion 7b of the light reflection sensor 7, with the result that it is possible to perform the accurate detection operation of the glass wafer.

In this embodiment, the light transmission sensor mounting bracket is described. A member which may reflect the sensor light from the light emitting portion of the light reflection sensor toward the light receiving portion of the light reflection sensor is preferably subjected to the same processing. More specifically, it is preferable that the direction of a normal line of a surface substantially facing the substrate to be detected be different from the optical axis direction of the light receiving portion of the light reflection sensor. Alternatively, a target surface is preferably subjected to treatment for suppressing the reflection of sensor light.

The FOUP main body may be colored. If so, it is expected that the amount of reflection light is changed depending on colors. Therefore, a threshold value of the amount of reflection light may be determined based on colors and the threshold value may be automatically adjusted based on FOUP recognition. In this embodiment, the detection of the wafer which is not stored in the pod at a predetermined position but slipped out from the pod is described. However, a case to which the detecting device according to the present invention is applied is not limited to only such a wafer slip-out case and thus the present invention can be applied to each process during which a wafer state is checked.

Figure 5:
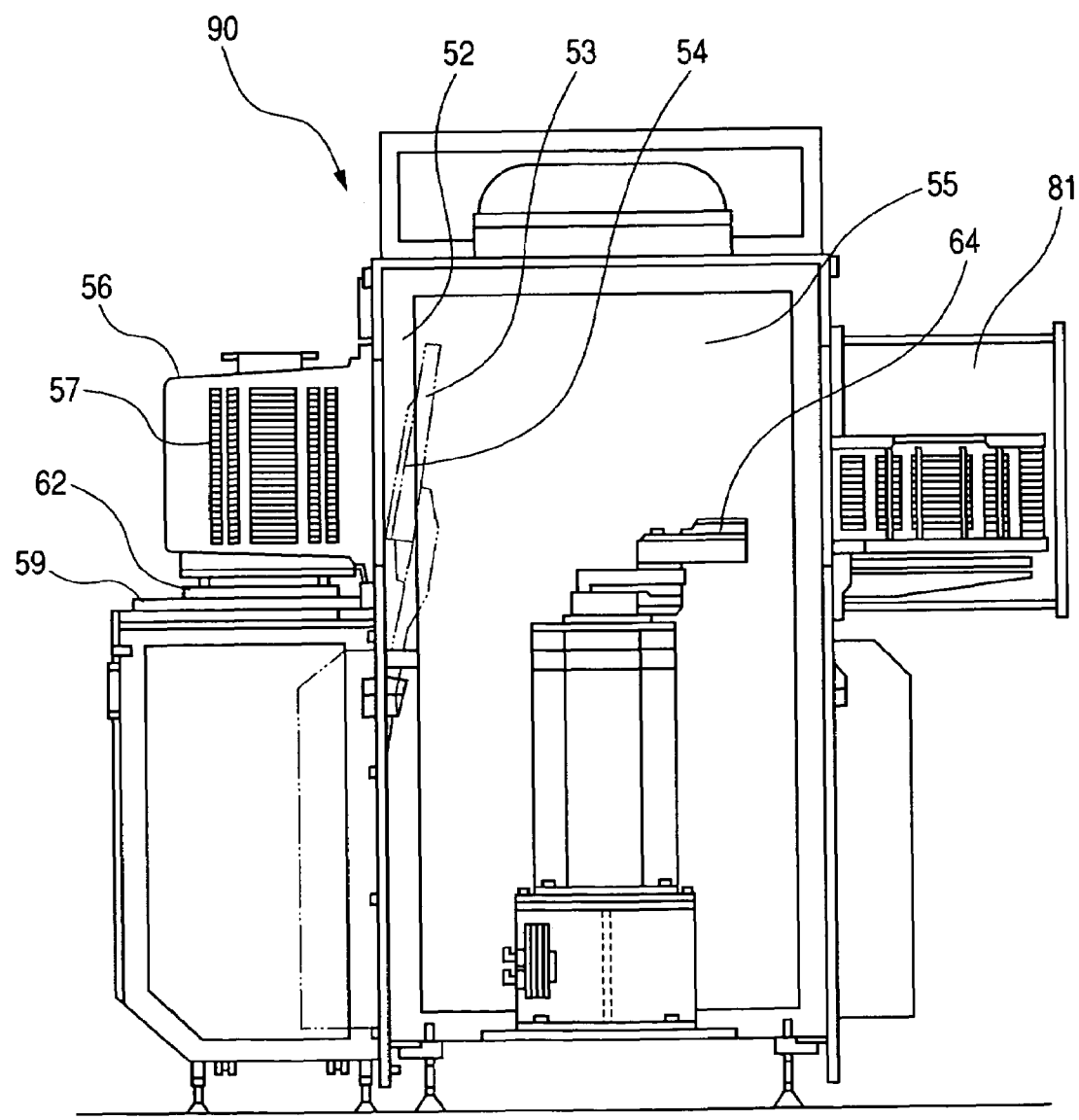
FIG. 5 is a schematic structural view showing a state in which a FIMS system and an FOUP are attached to a semiconductor manufacturing apparatus using the detecting device according to the embodiment of the present invention.
Figure 6A:
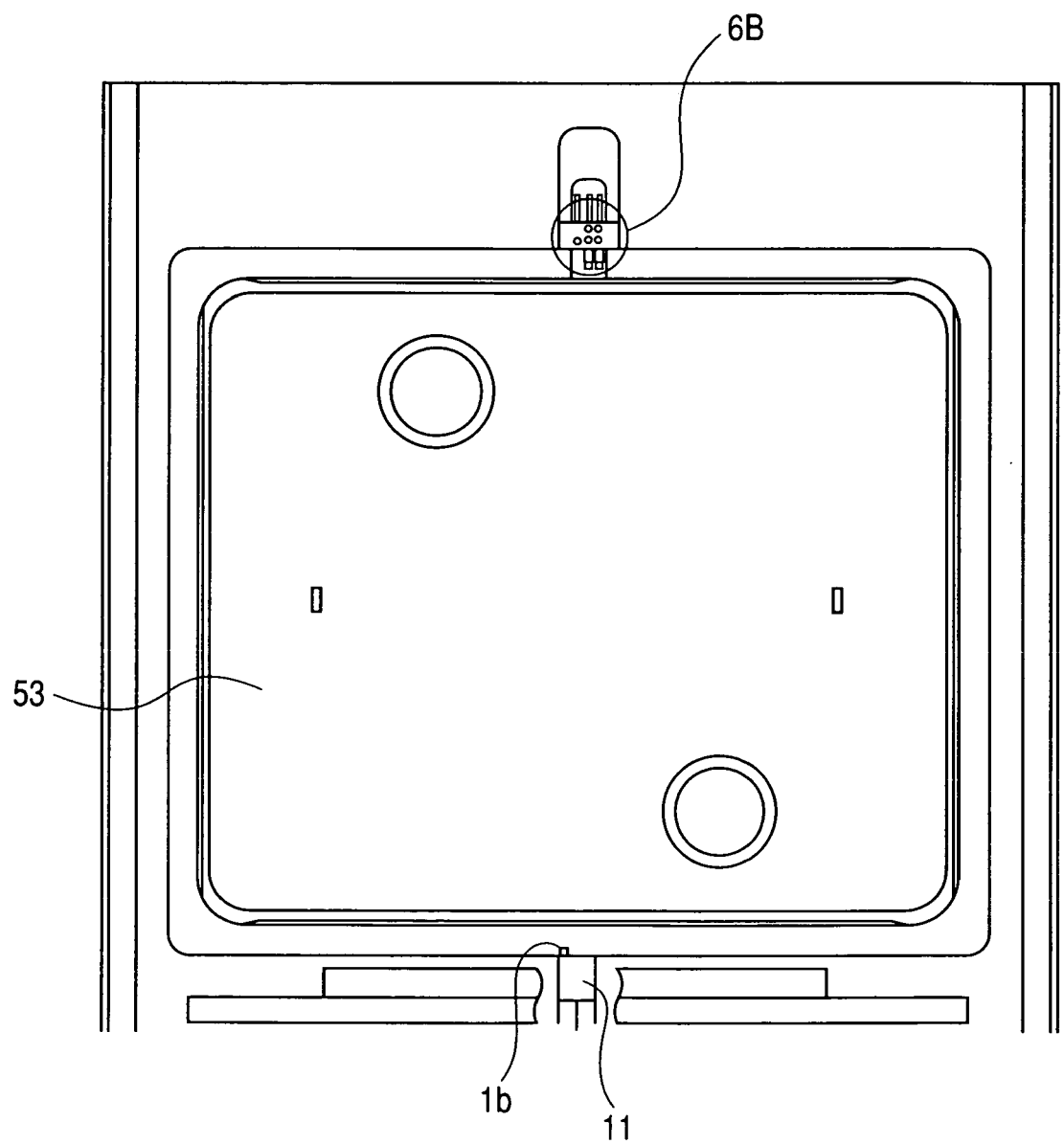
FIG. 6A is a front view showing an attachment state of the detecting device according to the embodiment of the present invention.
Figure 6B:
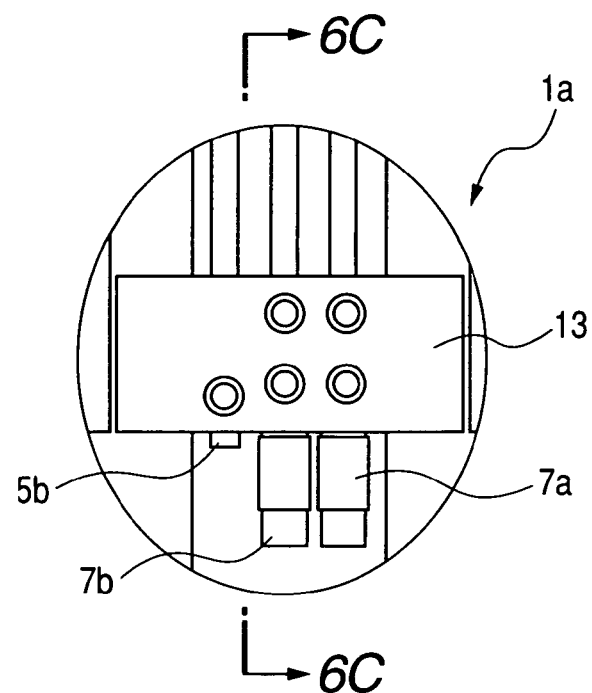
FIG. 6B is an enlarged view showing the detecting device shown in FIG. 6A.
Figure 6C:
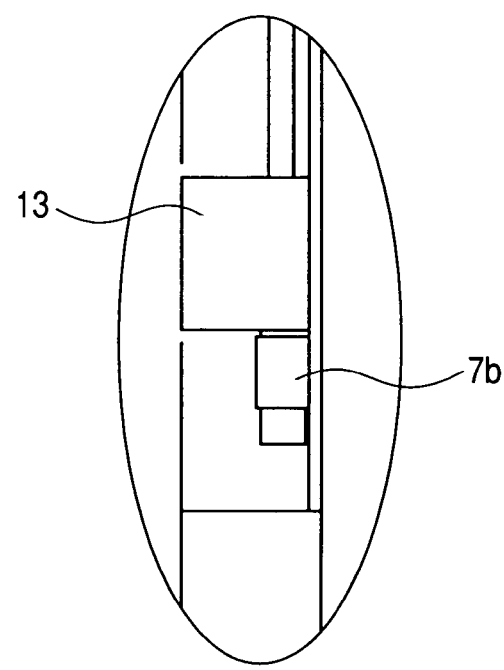
FIG. 6C is a cross sectional view taken along a line 6C-6C of FIG. 6B.

For example, an actual FIMS system including the detecting device according to the present invention, a pod mounted thereon, a wafer transfer apparatus to which the FIMS system is attached, and the like will be described as an embodiment of the present invention below with reference to FIGS. 5 and 6A to 6C. FIG. 5 is a schematic structural view showing a system including all the FIMS system, the pod, and the wafer transfer apparatus, for transferring a wafer or the like from the pod to a processing apparatus. FIG. 6A shows a state when an opening 52 described later is viewed from an external side of a mini-environment 55. FIG. 6B is an enlarged view showing the detecting device according to this embodiment, which is indicated by reference symbol 6B in FIG. 6A. FIG. 6C is a side view showing the detecting device shown in FIG. 6B. The system shown in FIG. 5 includes the mini-environment 55 in which a wafer transfer robot 64 is located in the center and a high cleanliness state is maintained, a substrate receiving stage 81 which provided in one of walls forming the mini-environment 55 and located on the processing apparatus (not shown) side, and a FIMS system 90 in the other of walls forming the mini-environment 55.

The FIMS system 90 includes the other wall forming the mini-environment 55, the opening 52, a door 53, and a mount base 62. The opening 52 is provided in the other wall forming the mini-environment 55. The door 53 is operated by a drive mechanism, which is not shown to close the mini-environment 55, so the opening 52 becomes in a close state. When the opening 52 is made to an open state, the door 53 can be moved downward. The mount base 62 can mount the pod 56 thereon such that an opening surface thereof faces the front of the opening 52. The mount base can be operated by a mount base driving device which is not shown to move the pod 56 to or from the opening 52. The pod 56 stores a plurality of wafers 57 spaced one another in a perpendicular direction. A lid 54 for closing the pod 56 is fixed to the opening surface of the pod 56. When the wafer is inserted to or removed from the FIMS system, the lid 54 is held by the door 53 and is moved together with the door 53 downward.

The door 53 shown in FIG. 6A is in an opening 52 close state. An upper unit 1a which is a part of the detecting device 1 according to the present invention is located in the upper center of the opening 52 on a mini-environment 55 side surface of a wall forming the opening 52. As described above, the upper unit 1a includes the light emitting portion 7a of the light reflection sensor, the light receiving portion 7b of the light reflection sensor, and the light receiving portion 5b of the light transmission sensor. These portions are fixed to a mounting bracket 13. The mounting bracket 13 is fixed to an upper surface of a wall forming the opening 52. In addition, these portions are arranged and fixed on a plane forming the opening 52 in substantially parallel along the mounting bracket 13. A shape of the mounting bracket 13 is set in advance so that, for example, a center portion of the light receiving portion of each of the sensors is located at a predetermined distance from an opening portion of the FOUP when the FOUP is set in the FIMS system (see FIG. 6C).

A lower unit 1b which is a part of the detecting device 1 is located in the lower center of the opening 52 on the mini-environment 55 side surface of the wall forming the opening 52. The lower unit 1b includes the light emitting portion 5a of the light transmission sensor. The light emitting portion 5a of the light transmission sensor is fixed to the lower mounting bracket 11. The light emitting portion 5a of the light transmission sensor is located substantially vertically below the light receiving portion 5b of the light transmission sensor. As described above, the upper surface 11a of the lower mounting bracket 11 is located so that the direction of a normal line thereof is different from the direction of the light receiving portion 7b of the light reflection sensor.

The present invention is devised for the glass wafer used in the same specification as that of the silicon wafer. However, the detecting device according to the present invention can be applied to, for example, a process using various transparent substrates including not only a glass wafer subjected to a semiconductor manufacture process but also a glass substrate for an LCD panel. The present invention can be applied to not only the slip-out of the glass wafer but also the detection of various states including the detection of the presence or absence of a wafer.

As many apparently widely different embodiments of the present invention can be made without departing from the sprit and scope thereof, it is to be understood that the invention is not limited to the specific embodiment thereof except as defined in the appended claims.

This application claims priority from Japanese Patent Application No. 2004-310326 filed Oct. 26, 2004, which is hereby incorporated by reference herein.

What is claimed is:

1. A detecting device for detecting a storage state of a substrate of a light transmission type in a predetermined position in a substrate processing apparatus using the substrate, comprising:

a light reflection sensor including a light emitting portion and a light receiving portion; and a light transmission sensor including a light emitting portion and a light receiving portion, wherein the light receiving portion of the light reflection sensor, the light emitting portion thereof, and the light receiving portion of the light transmission sensor are disposed on one surface side of the substrate to be detected in a position in which the substrate is located, and the light emitting portion of the light transmission sensor is disposed on the other surface side of the substrate to be detected in the position in which the substrate is located, and wherein the light receiving portion of the light reflection sensor uses inside surface reflection light which is caused in the inside of the substrate to be detected, and a sensor light emitted from the light emitting portion of the light reflection sensor is set such that an emission area of the sensor light on the substrate becomes larger than an emission area of the sensor light when the sensor light is emitted from the light emitting portion of the light reflection sensor.

2. A detecting device according to claim 1, further comprising a bracket for supporting the other of the light emitting portion of the light transmission sensor and the light receiving portion thereof, in which a direction of a normal line of a surface of the bracket substantially facing the substrate to be detected is different from an optical axis direction of the light receiving portion of the light reflection sensor.

3. A detecting device according to claim 1, wherein when at least one of a substrate detection signal generated by the light reflection sensor and a substrate detection signal generated by the light transmission reflection sensor is received, it is determined that the substrate is located in a detection position.

4. A detecting device according to claim 1, wherein the sensor light used for the light transmission sensor and the light reflection sensor comprises red visible light.

5. A detecting device according to claim 1, wherein an optical axis of the light emitting portion of the light transmission sensor is perpendicular to the surface of the substrate to be detected.

* * * * *